(12) United States Patent
Amrany et al.

(10) Patent No.: US 6,538,510 B1
(45) Date of Patent: Mar. 25, 2003

(54) HIGH EFFICIENCY, CURRENT SINK ONLY LINE DRIVER

(75) Inventors: Daniel Amrany, Ocean Township, NJ (US); Frank Ashley, South Plainfield, NJ (US); Frode Larsen, Tinton Falls, NJ (US); Arnold Muralt, Fair Haven, NJ (US)

(73) Assignee: Globespanvirata, Inc., Red Bank, NJ (US)

( * ) Notice: Subject to any disclaimer, the term of this patent is extended or adjusted under 35 U.S.C. 154(b) by 51 days.

(21) Appl. No.: 09/637,747

(22) Filed: Aug. 11, 2000

Related U.S. Application Data
(60) Provisional application No. 60/149,121, filed on Aug. 16, 1999.

(51) Int. Cl.[7] .............................. H03F 3/45; H03F 3/26; H03F 3/18
(52) U.S. Cl. ....................... 330/252; 330/255; 330/276; 330/264
(58) Field of Search ................................. 330/252, 253, 330/255, 276, 264

(56) References Cited

U.S. PATENT DOCUMENTS

| | | | | | |
|---|---|---|---|---|---|
| 4,296,382 A | * | 10/1981 | Hoover | ........................ | 330/264 |
| 4,345,502 A | * | 8/1982 | Jahns | .......................... | 330/264 |
| 4,480,230 A | * | 10/1984 | Brehmer et al. | ............. | 330/253 |
| 4,730,168 A | * | 3/1988 | Senderowicz et al. | ....... | 330/253 |
| 4,743,860 A | * | 5/1988 | Dziagwa | ..................... | 330/251 |
| 5,162,753 A | * | 11/1992 | Khorramabadi | ............. | 330/264 |
| 5,241,283 A | * | 8/1993 | Sutterlin | ...................... | 330/267 |
| 5,815,040 A | * | 9/1998 | Barbetta | ...................... | 330/255 |
| 5,825,244 A | * | 10/1998 | Somayajula | .................. | 330/253 |
| 5,825,247 A | * | 10/1998 | Herrlinger | ................... | 330/265 |
| 6,157,258 A | * | 12/2000 | Adishian et al. | ............. | 330/295 |
| 6,188,269 B1 | * | 2/2001 | Hauser | ........................ | 327/540 |

* cited by examiner

*Primary Examiner*—Patricia Nguyen
(74) *Attorney, Agent, or Firm*—Thomas, Kayden, Horstemeyer & Risley

(57) ABSTRACT

An improved line driver and method for increasing the available signal transmit power on a transmission line are disclosed. The improved line driver achieves an available transmit power increase by limiting the output stage signal path to NMOS and NPN bipolar semiconductor devices. The output stage of the improved line driver may comprise a first amplifier, a second amplifier, a first transformer, a second transformer, and a plurality of back-matching resistor networks. A second embodiment of an improved output stage of a line driver may comprise a first amplifier, a second amplifier, a transformer, and a plurality of back-matching resistor networks. Both preferred embodiments may be implemented with CMOS and bipolar semiconductor devices, as well as, a combination of the two semiconductor technologies. In its broadest terms, the method for increasing the available signal transmit power on a transmission line can be described as: applying a transmit signal to an input stage of an integrated line driver; amplifying the transmit signal in the output stage of a line driver using amplifier components selected from the group consisting of NMOS and NPN bipolar semiconductor devices in the output stage signal path; and applying the amplified transmit signal via a plurality of resistor networks to the transmission line.

35 Claims, 8 Drawing Sheets

US 6,538,510 B1

HIGH EFFICIENCY, CURRENT SINK ONLY LINE DRIVER

CROSS-REFERENCE TO RELATED APPLICATION

The present application claims the benefit of U.S. provisional patent application, issued Ser. No. 60/149,121, and filed Aug. 16, 1999, which is hereby incorporated by reference in its entirety.

FIELD OF THE INVENTION

The present invention generally relates to high-speed data communications. More specifically, the invention relates to an improved efficiency integrated current sink only line driver, which solves problems associated with the inherent transconductance difference between NMOS and PMOS devices.

BACKGROUND OF THE INVENTION

With the advancement of technology, and the need for instantaneous information, the ability to transfer digital information from one location to another, such as from a central office (CO) to a customer premise (CP), has become more and more important.

In a digital subscriber line (DSL) communication system, data is transmitted from a CO to a CP via a transmission line, such as a two-wire twisted pair, and is transmitted from the CP to the CO as well, either simultaneously or in different communication sessions. The same transmission line might be utilized for data transfers by both sites or the transmission to and from the CO might occur on two separate lines. In this regard reference is now directed to FIG. 1, which illustrates a prior art xDSL communication system 1. Specifically, FIG. 1 illustrates communication between a central office (CO) 10 and a customer premise (CP) 20 by way of twisted-pair telephone line 30. While the CP 20 may be a single dwelling residence, a small business, or other entity, it is generally characterized as having plain old telephone system (POTS) equipment, such as a telephone 22, a public switched telephone network (PSTN) modem 25, a facsimile machine (not shown), etc. The CP 20 may also include an xDSL communication device, such as an xDSL modem 23 that may permit a computer 24 to communicate with one or more remote networks via the CO 10. When a xDSL service is provided, a POTS filter 21 is interposed between the POTS equipment such as the telephone 22 and the twisted-pair telephone line 30. As is known, the POTS filter 21 includes a low-pass filter having a cut-off frequency of approximately 4 kilohertz to 10 kilohertz, in order to filter high frequency transmissions from the xDSL modem 23 and to protect the POTS equipment.

At the CO 10, additional circuitry is provided. Generally, a line card 18 (i.e., Line Card A) containing line interface circuitry is provided for electrically coupling a data transmission to the twisted-pair telephone line 30. In fact, multiple line cards 14, 18 may be provided (two shown for simplicity of installation) to serve a plurality of local loops. In the same way, additional circuit cards are typically provided at the CO 10 to handle different types of services. For example, an integrated services digital network (ISDN) interface card 16, a digital loop carrier line card 19, and other circuit cards supporting similar and other communication services, may be provided.

A digital switch 12 is also provided at the CO 10 and is configured to communicate with each of the various line cards 14, 16, 18, and 19. On the outgoing side of the CO (i.e., the side opposite the various local loops), a plurality of trunk cards 11, 13, and 15 are typically provided. For example, an analog trunk card 11, a digital trunk card 13, and an optical trunk card 15 are illustrated in FIG. 1. Typically, these circuit cards have outgoing lines that support numerous multiplexed DSL service signal transmissions.

Having introduced a conventional xDSL communication system 1 as illustrated and described in relation to FIG. 1, reference is now directed to FIG. 2, which is a prior art functional block diagram illustrating the various elements in a xDSL communications link 40 between a line card 18 located within a CO 10 and a xDSL modem 23 located at a CP 20. In this regard, the xDSL communications link 40 of FIG. 2 illustrates transmission of data from a CO 10 to a CP 20 via a twisted-pair telephone transmission line 30 as may be provided by a POTS service provider to complete a designated xDSL communications link 40 between a CO 10 and a CP 20. In addition, FIG. 2 further illustrates the transmission of data from the CP 20 to the CO 10 via the same twisted-pair telephone transmission line 30. With regard to the present illustration, data transmissions may be directed from the CP 20 to the CO 10, from the CO 10 to the CP 20 or in both. directions simultaneously. Furthermore, data transmissions can flow on the same twisted-pair telephone transmission line 30 in both directions, or alternatively on separate transmission lines (one shown for simplicity of illustration). Each of the separate transmission lines may be designated to carry data transfers in a particular direction either to or from the CP 20.

The CO 10 may include a line card 18 (see FIG. 1) that may comprise a CO-digital signal processor (DSP) 43, a CO-analog front end (AFE) 45, a CO-line driver 47 and a CO-hybrid 49. As illustrated in FIG. 2, the CO-DSP 43 may receive digital information from one or more data sources (not shown) and may send the digital information to a CO-analog front end (AFE) 45. The CO-AFE 45 interposed between the twisted-pair telephone transmission line 30 and the CO-DSP 43 may convert digital data, from the CO-DSP 43, into a continuous time analog signal for transmission to the CP 20 via the one or more twisted-pair telephone transmission lines 30.

One or more analog signal representations of digital data streams supplied by one or more data sources (not shown) may be converted in the CO-AFE 45 and further amplified and processed via a CO-line driver 47 before transmission by a CO-hybrid 49, in accordance with the amount of power required to drive an amplified analog signal through the twisted-pair telephone transmission line 30 to the CP 20.

As further illustrated in FIG. 2, a xDSL modem 23 located at a CP 20 may comprise a CP-DSP 42, a CP-AFE 44, a CP-line driver 46, and a CP-hybrid 48. The CP-hybrid 48, located at the CP 20, may de-couple a received signal from the transmitted signal in accordance with the data modulation scheme implemented by the particular xDSL data transmission standard in use. The CP-AFE 44, located at the CP 20, having received the de-coupled received signal from the CP-hybrid 48, may then convert the received analog signal into a digital signal, which may then be transmitted to a CP-DSP 42 located at the CP 20. Finally, the digital information may be further transmitted to one or more specified data sources such as the computer 24 (see FIG. 1).

In the opposite data transmission direction, one or more digital data streams supplied by one or more devices in communication with the CP-DSP 42 at the CP 20 may be converted by the CP-AFE 44 and further amplified via CP-line driver 46. The CP-hybrid 48, located at the CP 20, may then be used to couple the intended analog representations of the various digital signals to a transmit signal in accordance with the data modulation scheme implemented by the particular xDSL data transmission standard in use. As will be appreciated by those skilled in the art, the CP-line driver 46 may amplify and forward the transmit signal with the power required to drive an amplified analog signal through the twisted-pair telephone transmission line 30 to the CO 10. It is significant to note that the CP-hybrid 48 is used to regenerate the transmit signal so the transmit signal may be subtracted from the receive signal when the DSL is receiving. As a result, the CP-hybrid 48 does not affect the transmitted signal in any way. The CO-AFE 45 may receive the data from the CO-hybrid 49, located at the CO 10, which may de-couple the signal received from the CP 20 from the signal transmitted by the CO 10. The CO-AFE 45 may then convert the received analog signal into one or more digital signals, which may then be forwarded to the CO-DSP 43 located at the CO 10. Finally, the digital information may be further distributed to one or more specified data sources (not shown) by the CO-DSP 43.

Having briefly described a xDSL communications link 40 between the line card 18 located within the CO 10 and the xDSL modem 23 located at the CP 20 as illustrated in FIG. 2, reference is now directed to FIG. 3. In this regard, FIG. 3 is a prior art circuit schematic illustrating a conventional line driver 47. In communication systems designed to transmit data over metallic transmission lines, the line driver 47 is an amplifier which delivers the energy required to transmit the intended signal to the line via a back-matching resistor 70. Often impedance and voltage scaling is performed by coupling the output from the line driver 47 amplifiers to the transmission line 30 via a transformer 80.

The back-matching resistor 70 serves two purposes. First, the back-matching resistor 70 serves to match the impedance at the end of the transmission line 30. In order to provide a sufficient return loss, a resistor approximately equal to the line's characteristic impedance 82 should terminate the line. Second, the back-matching resistor 70 permits the line driver 47 to simultaneously receive signals generated from a remote transmitter coupled to the transmission line 30 at the same time the line driver 47 is transmitting. The line driver 47 alone cannot terminate the transmission line 30 because the line driver 47 presents a low impedance to the remotely transmitted signal. The remotely transmitted signal may be recovered by subtracting from the voltage on the transmission line 30 the voltage introduced on the transmission line by the local transmitter. A hybrid amplifier 90 can perform the task of separating and recovering the remotely transmitted signal from the transmission line 30. Each of these elements is present in the circuit schematic of a prior art conventional line driver 47 as illustrated in FIG. 3.

As illustrated in FIG. 3, a differential signal input (i.e., $V_{in}^+ - V_{in}^-$) to the conventional line driver 47 is fed into the input of a pre-amplifier stage, comprising pre-amps 60, 62 (herein labeled PRE-AMP A and PRE-AMP B). The pre-amplifier stage then feeds the high-power driver amplifiers 64, 66 (herein labeled DRIVER A and DRIVER B). The pre-amplifier stage, if implemented via complementary metal oxide semiconductor (CMOS) technology, would have nearly infinite input impedance. The outputs of the high-power driver amplifiers 64, 66 are loaded by the combination of the back-matching resistors 70, herein designated, $R_t$, in series with the line impedance 82, herein labeled, $Z_l$.

As further illustrated in FIG. 3, the outputs of the high-power driver amplifiers 64, 66 are fed to a scaled version of the load via back-matching resistors 72, herein labeled, $nR_t$, and an emulated line impedance 84, labeled $nZ_l$ in addition to being coupled to a load 100. The load 100 may comprise the transformer 80, the twisted-pair telephone transmission line 30, and the line impedance 82. The transmit signal generated across the emulated line impedance 84, $nZ_l$, is subtracted from the combined receive and transmit voltage appearing at the primary of the transformer 80 by a hybrid amplifier 90. As further illustrated in FIG. 3, the output of the hybrid amplifier 90, VR−(−VR) should comprise the received signal from a remotely located transmitter after the transmit signal has been subtracted, or 2VR. The back-matching resistors 70 emulate the impedance of the transmission line 82 as seen looking into the primary of a transformer 80. For simplicity, the transformer 80 illustrated in the circuit of FIG. 3 has a 1:1 turns ratio. As a result $R_t$ 70 approximates ½ $Z_l$.

Having briefly described the operation of a prior art conventional line driver 47 as illustrated in the circuit schematic of FIG. 3, reference is now directed to FIG. 4, which illustrates a schematic view of the output stage of a CMOS line driver 200. The focus of FIG. 4 is on the core output stage of a prior art CMOS line driver 200. For ease of illustration and discussion, the pre-amplifier and high-power gain stages, the class A-B control stage, and the hybrid amplifier all typical elements of a line driver 47 are not illustrated. Those skilled in the art will appreciate and understand the operation and implementation of the circuitry required to realize the omitted portions of the line driver 47 and the hybrid 49. As a result, the omitted portions of the line driver 47 and the hybrid 49 need not be described herein in order to appreciate the current sink only line driver that will be introduced and described with regards to FIGS. 5 through 8.

As illustrated in FIG. 4, the output stage of a conventional CMOS line driver 200 may comprise a pair of PMOS (MP) and NMOS (MN) devices herein designated as AMP A OUTPUT STAGE and AMP B OUTPUT STAGE. The PMOS device may source current from a power supply (not shown) into the load 100 while the NMOS device on the other side of the transformer 80 sinks the same current from the load 100 into ground. The preceding stage, not shown in this simplified schematic, performs the input sensing, amplification, and the class A-B quiescent current cross over control for the illustrated output devices. The class A-B quiescent current control typically limits the current drawn from the non-active device to a significantly smaller value than the maximum current for the semiconductor device in order to increase efficiency. It is significant to note that the two amplifiers AMP A and AMP B work as a pair. The load 100 current flows from VDD through a MP device on one amplifier, through the load 100, and on to ground through a MN device on the opposite amplifier. One of the two amplifiers, AMPs A, B is required to source as much current as the other amplifier on the opposite side of the load 100 is required to sink. In addition, there is a significantly smaller class A-B current flowing through the other device in order to avoid excessive distortion introduced when switching between sinking and sourcing load current on each side of the conventional CMOS output driver 200. Those skilled in the art will appreciate that the amplifier configuration illustrated in FIG. 4 is commonly referred to as a push-pull amplifier.

In general, for most semiconductor technologies, it is significantly more difficult to source currents having a large magnitude than it is to sink currents having a large magnitude. For CMOS technology, the transconductance of a NMOS device is typically a factor of three larger than the transconductance of a PMOS device of the same size biased with the same current. Thus, if both a NMOS and a PMOS device have to handle a current of the same magnitude, the PMOS device would have to be three times as large as the NMOS device. For CMOS line driver architectures, the transconductance difference becomes a significant issue as the capacitive load seen by the preamplifier stage becomes unreasonably large if the line driver 47 (see FIGS. 2 and 3) needs to deliver a current of several hundred milli-amperes. As the capacitive load increases, the achievable speed of the line driver 47 is reduced. It is important to note that ¾ of the capacitive load is introduced by the PMOS (MP) device.

The peak currents required using the conventional CMOS output driver 200 for various xDSL communication standards may be identified using the following formula:

$$I_p = \frac{PAR^2}{V_p} * 10^{\left(\frac{PWR}{10}\right)}, \qquad \text{Eq. 1}$$

where $I_p$ is the peak current in mA, PAR is the peak-to-average ratio for the encoding method associated with the xDSL standard, PWR is the power delivered to the line in dBm, and $V_p$ is the single-ended peak voltage across the primary of the transformer 80. If 3 Vpp is applied across the transmission line 30 (an attainable peak-to-peak output signal voltage using a conventional 5 Volt CMOS line driver), the required peak current for HDSL2 (16.8 dBm pulse amplitude modulation (PAM), PAR=3.8) would be 461 mA. If the same 3 Vpp is applied across the transmission line 30, the required peak current for ADSL-CP (12.5 dBm discrete multi-tone (DMT); PAR=5.1) would be 308 mA. Likewise, the required peak current for ADSL-CO (20.5 dBm DMT; PAR=5.1) would be 1945 mA, clearly beyond the capabilities of currently available conventional 5 Volt CMOS line drivers, as conventional 5 Volt CMOS line drivers have a maximum output current typically in the 100 mA through 350 mA range.

A brief look at bipolar and BiCMOS semiconductor technologies may highlight some additional functional and economic reasons for designing away from a conventional push-pull amplifier. Both bipolar and BiCMOS semiconductor manufacturing technologies typically optimize vertical isolated NPN devices for high performance. Usually, little effort is expended developing a high performance PNP device. For most BiCMOS manufacturing processes and even some bipolar manufacturing processes, the only PNP available is a lateral PNP, which has a unity gain frequency more than 100 times lower than a NPN device. This makes the technology less than adequate if a PNP device is part of the signal path.

In addition, most BiCMOS processes do not incorporate a lateral vertical isolated PNP device due to the added masks required and the associated cost and complexity of constructing such a device. For example, manufacturing a vertical isolated PNP for a typical medium cost bipolar manufacturing process may entail a cost increase of about 30%. For a typical low cost BiCMOS semiconductor manufacturing process, a vertical isolated PNP may entail a cost increase of approximately 40%.

Accordingly, there is a need for an improved line driver configuration that relies more heavily on sinking output currents rather then sourcing output currents in order to meet the maximum power requirements for most xDSL applications.

SUMMARY OF THE INVENTION

In light of the foregoing, the invention is a circuit and a method for constructing a line driver capable of sinking output currents with NMOS devices that is not required to push or source a significant amount of current. An output stage comprising NMOS devices, or alternatively NPN bipolar semiconductor devices, may be capable of delivering up to 4 times the current with an integrated circuit footprint of a similar size than previous line drivers utilizing a push-pull circuit architecture. In addition, an output stage comprising NMOS or NPN devices may be capable of delivering the increased current with a similar capacitive load as that seen by preamplifiers in push-pull line driver architectures.

The improved line driver architecture of the present invention provides increased performance and enables more power delivered to the line by increasing the maximum output current for a given rate and distortion. An improved line driver output stage may comprise a first amplifier, a second amplifier, a first transformer, a second transformer, and a plurality of back-matching resistor networks. A second preferred embodiment of an improved output stage of a line driver may comprise a first amplifier, a second amplifier, a transformer, and a plurality of back-matching resistor networks. Both preferred embodiments may be implemented with CMOS and bipolar semiconductor devices, as well as, a combination of the two semiconductor technologies.

The present invention can also be viewed as providing a method for increasing the available signal transmit power along a transmission line. In its broadest terms, a method for increasing the available signal transmit power on a transmission line can be described as: applying a transmit signal to an input stage of an integrated line driver; amplifying the transmit signal in the output stage of a line driver using amplifier components selected from the group consisting of NMOS and NPN bipolar semiconductor devices in the output stage signal path; and applying the amplified transmit signal via a plurality of resistor networks to the transmission line.

Other features and advantages of the present invention will become apparent to one skilled in the art upon examination of the following drawings and detailed description. It is intended that all such additional features and advantages be included herein within the scope of the present invention, as defined by the claims.

BRIEF DESCRIPTION OF THE DRAWINGS

The present invention will be more fully understood from the detailed description given below and from the accompanying drawings of the preferred embodiment of the invention, which however, should not be taken to limit the invention to the specific embodiments enumerated, but are for explanation and for better understanding only. Furthermore, the drawings are not necessarily to scale, emphasis instead being placed upon clearly illustrating the principles of the invention. Finally, like reference numerals in the figures designate corresponding parts throughout the several drawings.

DETAILED DESCRIPTION OF THE PREFERRED EMBODIMENTS

Figure 5:
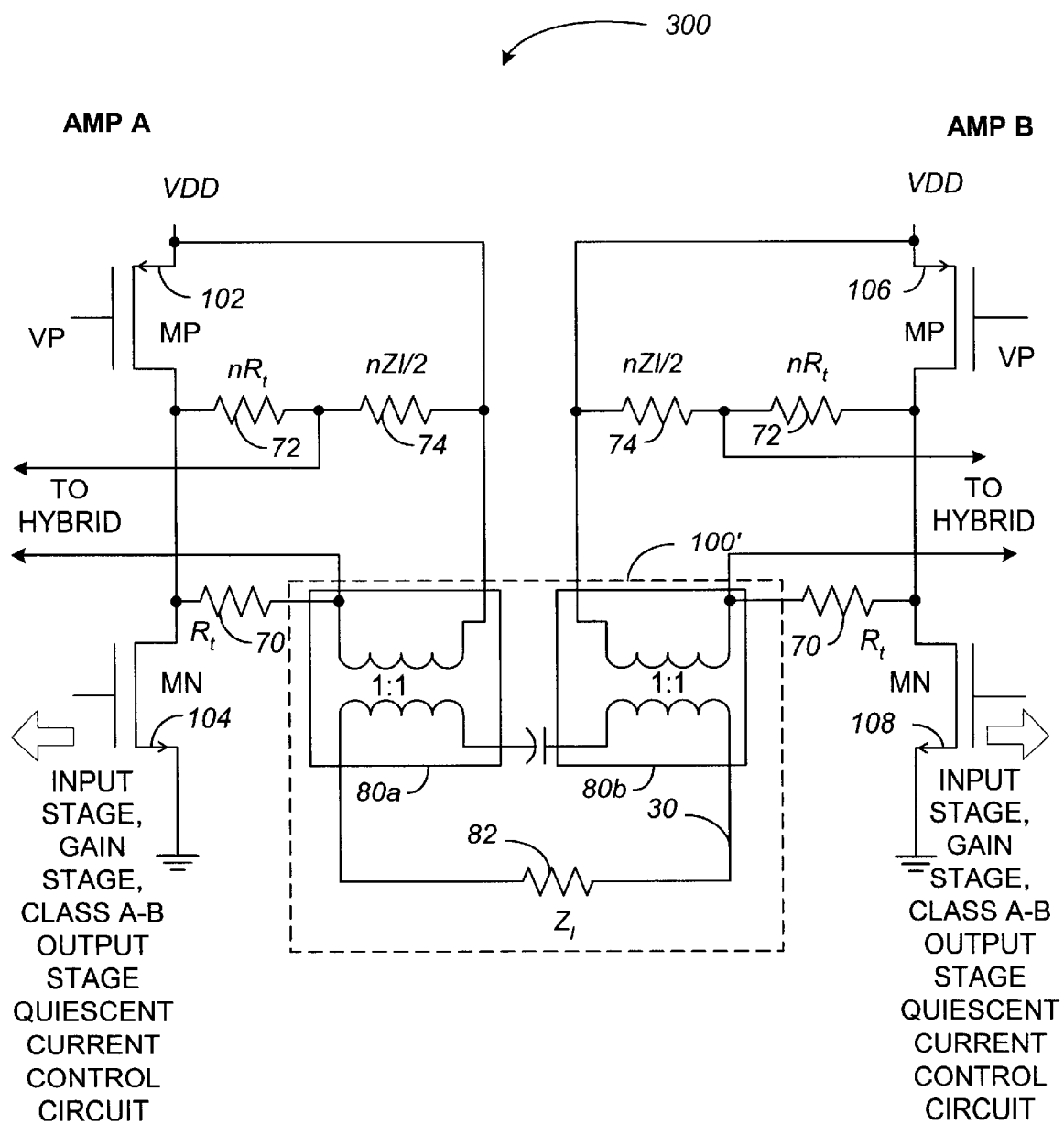
FIG. 5 is a circuit schematic of a first embodiment of an improved output stage of a CMOS line driver in accordance with the present invention.

Turning now to the drawings illustrating the present invention, wherein like reference numerals designate corresponding parts throughout the drawings, FIG. 5 illustrates a circuit schematic of an improved output stage of a CMOS line driver in accordance with the present invention. In this regard, an improved output stage of a CMOS line driver 300 may comprise a first amplifier, AMP A, a second amplifier, AMP B, a load 100', and a plurality of back-matching resistors 70, 72, and 74. The first amplifier, AMP A, may comprise a PMOS device (MP) 102 in series with a NMOS device (MN) 104. The second amplifier, AMP B, may comprise a PMOS device (MP) 106 in series with a NMOS device (MN) 108. The load 100' may comprise a first transformer 80a, a second transformer 80b, the twisted-pair telephone transmission line 30, and may be characterized by a load impedance 82, herein designated $Z_l$.

Figure 1:
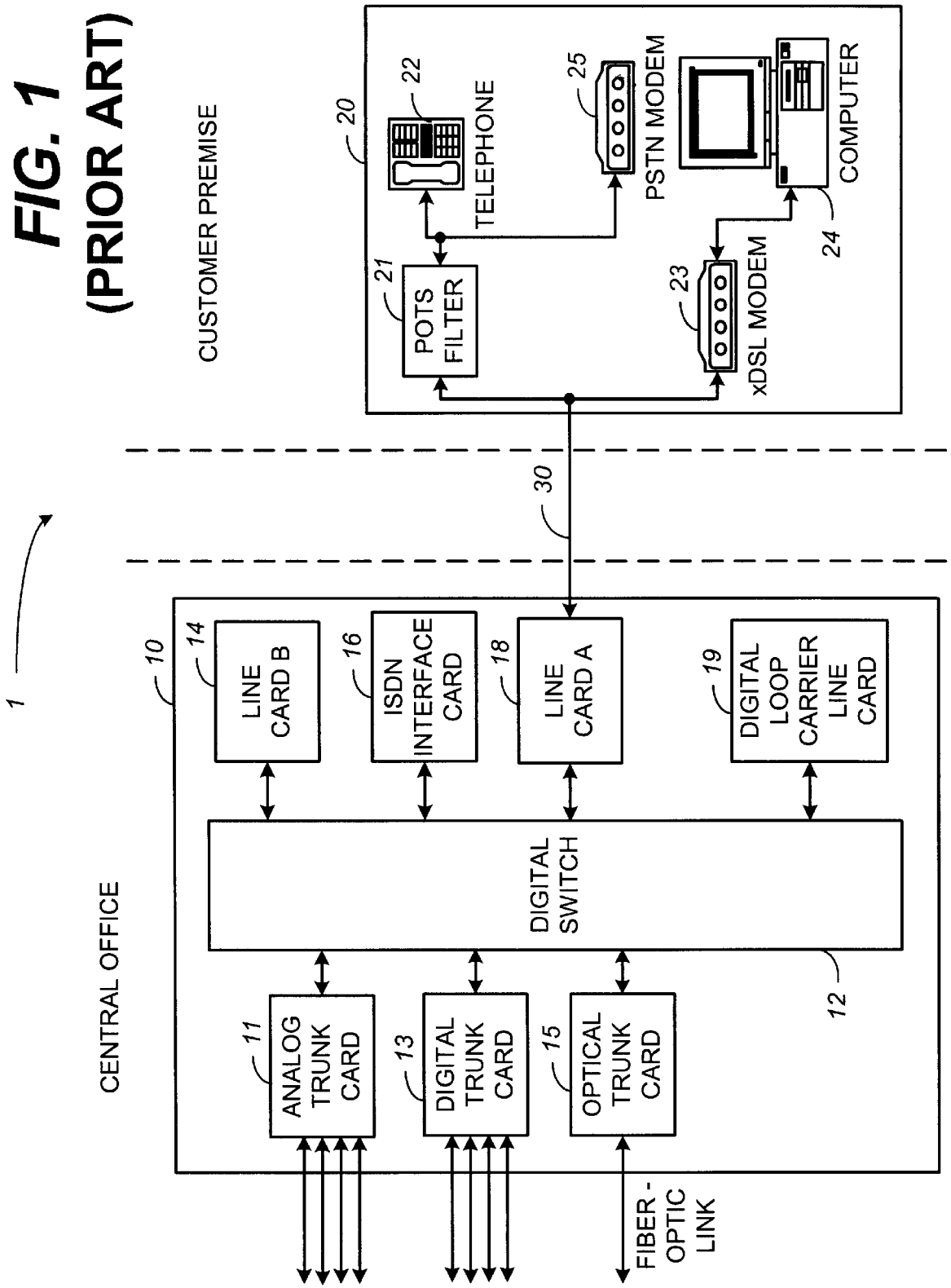
FIG. 1 is a prior art block diagram illustrating a xDSL communications system between a CO and a CP.
Figure 2:
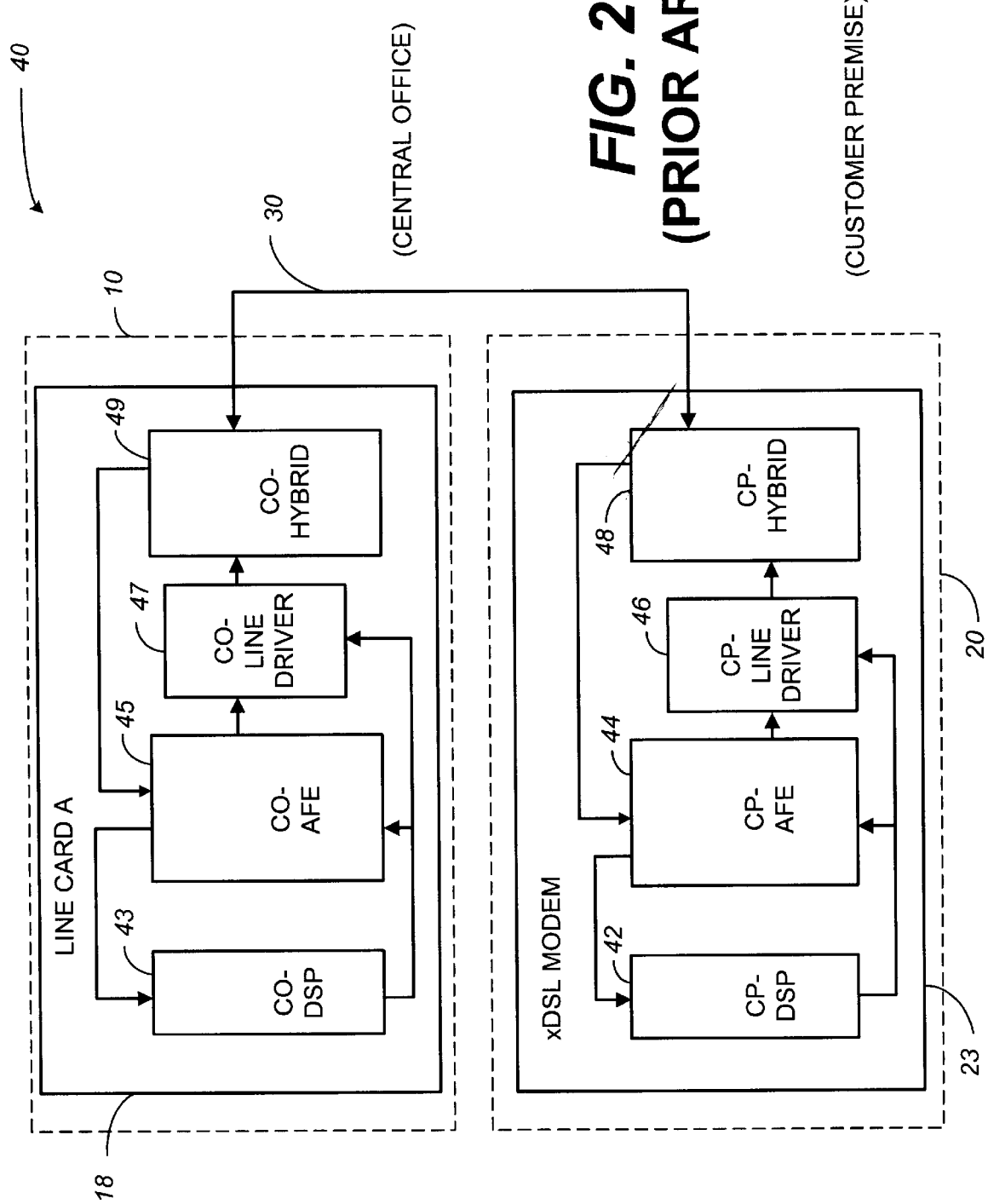
FIG. 2 is a prior art block diagram illustrating a xDSL communication link used in the xDSL communication system of FIG. 1 between a line card and a xDSL modem.
Figure 3:
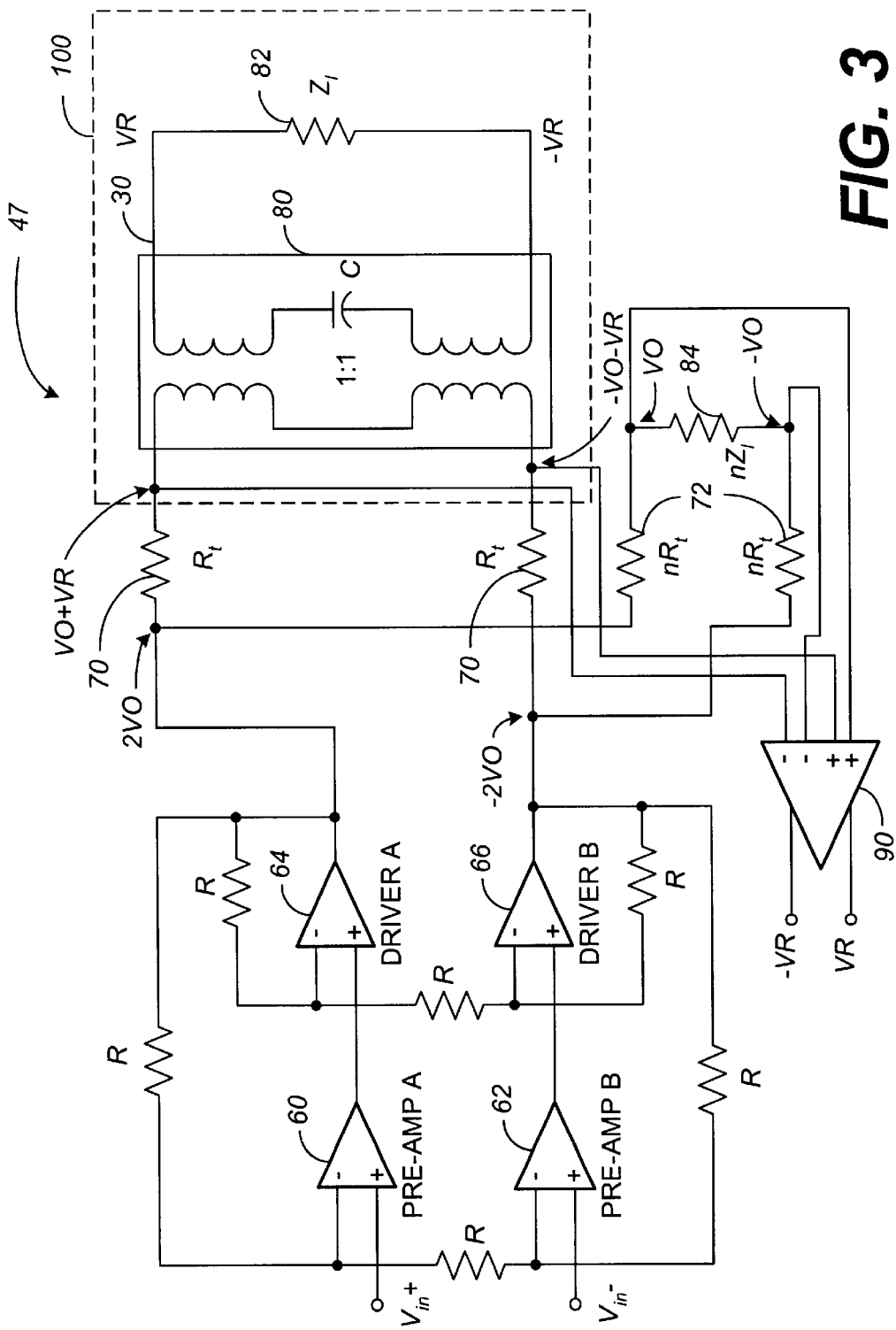
FIG. 3 is a prior art circuit schematic of a conventional line driver that may be used in the xDSL communication link of FIG. 2.
Figure 4:
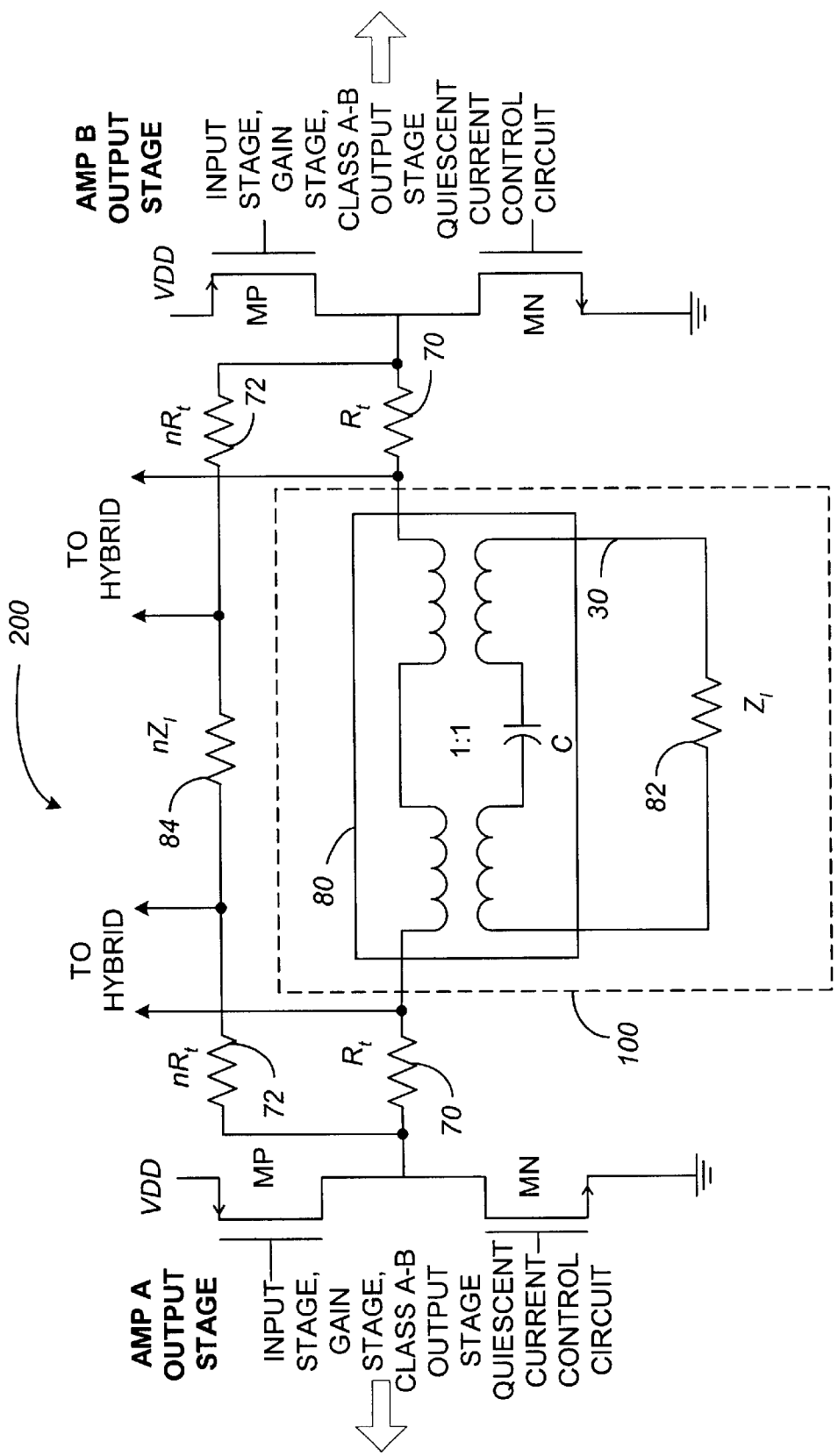
FIG. 4 is a prior art circuit schematic of an output stage of a CMOS line driver.

A hybrid resistor network comprising the plurality of back-matching resistors 70, 72, and 74 may represent a scaled version of the transmission line load 100 with a first portion of the hybrid resistor network interposed between the MP 102 and the MN 104 devices of the first amplifier and with a second portion of the hybrid resistor network interposed between the MP 106 and the MN 108 devices of the second amplifier. The hybrid resistor network enables both the CO 10 and the CP 20 portions of the xDSL communication system 1 (see FIG. 1) to recover a remotely transmitted signal. As illustrated in FIG. 5, a parallel branch comprising resistors $nR_t$ 72 and $nZ_l/2$ 74, where all resistance values are scaled by a factor of n may be used to recover the remotely transmitted signal. The signal generated across the first and the second transformers 80a, 80b is the sum of the local transmit signal and the remotely generated receive signal, while the output of the hybrid resistor network contains the transmit signal. By mathematically combining the two signals, the desired receive signal can be recovered. The output of the hybrid amplifier 90 (see FIG. 3) is simply the difference between the two voltage sums as outlined in FIG. 3 and restated in the equation below.

$$V_{out}\text{Hybrid}=2VR=VR-(-VR)=[(VR+VO)-VO]-[(-VR-VO)+VO] \quad \text{Eq. 2}$$

The same equation can be applied for the circuit architecture illustrated in FIG. 5.

As illustrated in FIG. 5, the improved output stage of a line driver 300 may supply current to the two separate transformers 80a, 80b, which alternate to couple the required flux into the secondary of the transformer 80a, 80b pair in the opposite direction. As further illustrated in FIG. 5, the opposite side of each transformer primary may be coupled to the supply voltage, VDD. Thus, the circuit of FIG. 5 may achieve a bipolar output at the secondary of the transformer 80a, 80b pair without altering the direction of the current flow through either of the primaries of the transformer 80a, 80b pair.

Figure 6:
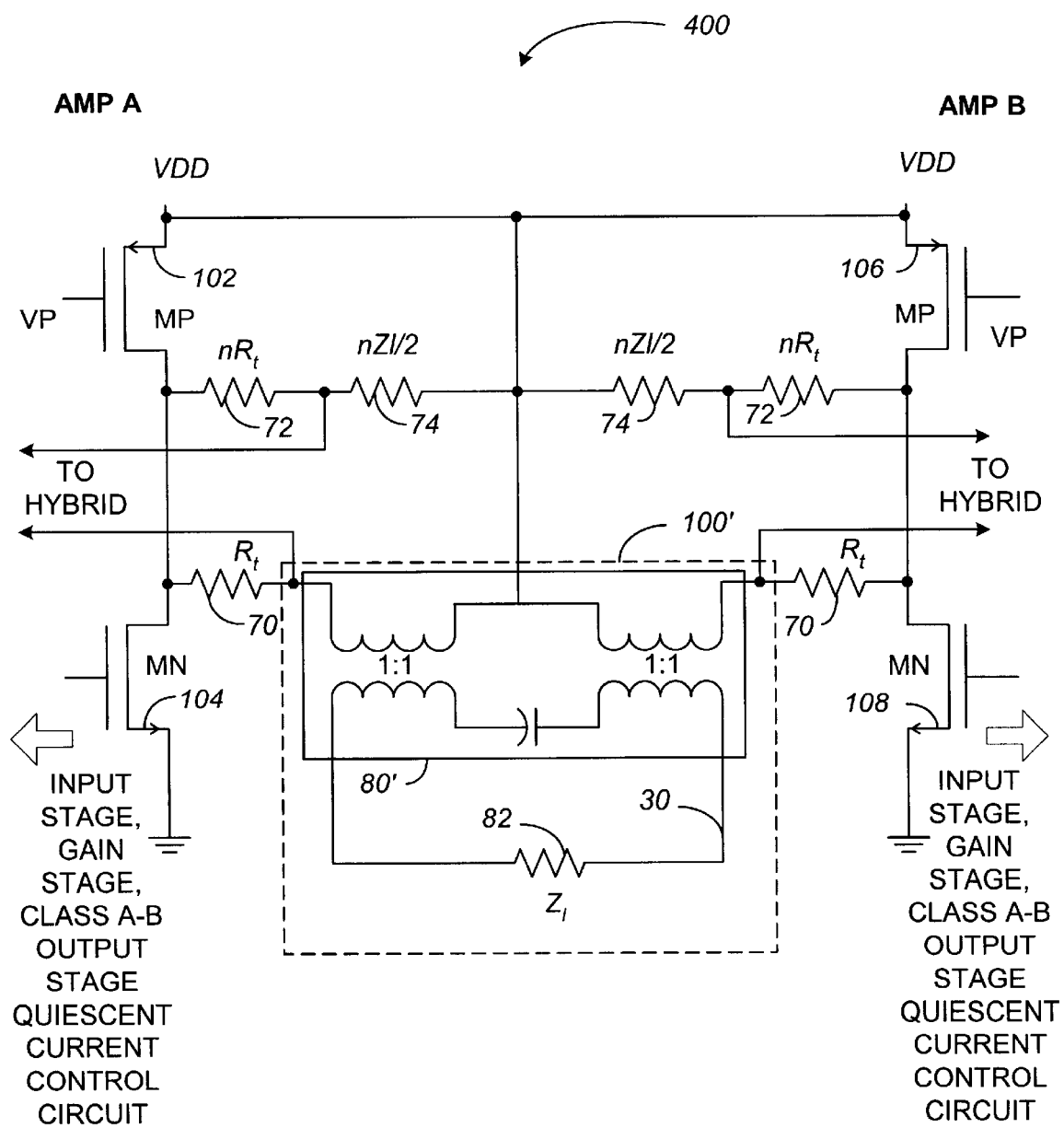
FIG. 6 is a circuit diagram of a second embodiment of an improved output stage of a CMOS line, driver in accordance with the present invention.

Having introduced and described a first embodiment of an improved output stage of a CMOS line driver 300 in accordance with the present invention with regard to FIG. 5, reference is now directed to FIG. 6. In this regard, FIG. 6 illustrates a circuit diagram depicting a second alternative embodiment of an improved output stage of a CMOS line driver in accordance with the present invention. As illustrated in FIG. 6, an improved output stage of a CMOS line driver 400 may comprise a first amplifier, AMP A, a second amplifier, AMP B, a load 100', and integrated back-matching resistors 70, 72, and 74. The load 100' may comprise a center tap transformer 80', the twisted-pair telephone transmission line 30, and may be characterized by a load impedance 82, herein designated $Z_l$.

Both the first amplifier, AMP A, and the second amplifier, AMP B, may comprise a plurality of semiconductor devices. As illustrated in FIG. 6, AMP A may comprise a series combination of PMOS and NMOS devices. Proceeding from VDD at the top of FIG. 6 to ground, AMP A may comprise PMOS device (MP) 102 and NMOS device (MN) 104. Similarly, AMP B may comprise PMOS device (MP) 106 and NMOS device (MN) 108. As illustrated in FIG. 6, two back-matching resistors herein designated $R_t$ 70 may be coupled between the primary of the transformer 80' and a node interposed between a series combination of the MP 102, 106 and MN 104, 108 devices of the first and second amplifiers respectively. In addition, a series combination of scaled resistors $nR_t$ 72 and $nZ_l/2$ 74 may be interposed in parallel with the two back-matching resistors $R_t$ 70 between VDD, the center tap of the transformer 80', and the node interposed between the first and second amplifiers respectively.

In this regard, FIG. 6 illustrates a different implementation suitable for line drivers that supply a transmission line 30 via a line transformer with a center tap 80'. This preferred implementation is possible as most line transformers are constructed symmetrically, with or without access to a center tap. Both halves of the transformer 80' may be separated into two identical halves to enable control of the common mode input of the primary on a first half or side, and delivery of a feather current and the 48-Volt supply from the line on the secondary side.

The supply voltage may be fed to the center tap of the primary of the transformer 80'. The two PMOS devices 102, 106 may provide the output stage with the appropriate quiescent current, $I_b$, required for allowable cross over distortion. The two PMOS devices 102, 106 can therefore be considered as current sources, biased with a voltage VP, which provides a quiescent current, $I_b$. With no signal applied to the input of the improved line driver output stage 400 of the present invention, the preamplifier stage (see FIG. 3) will adjust the gate drive of both NMOS devices 104, 108 such that both gate voltages may be at a low voltage. The voltage at the gates of the NMOS devices 104, 108 may be just high enough to permit sourcing of the current supplied from the PMOS devices 102, 106, as well as, a slight current through the back-matching resistors, $R_t$, 70 from the supply. Typically, both drains may see approximately 4.9 Volts. It should be noted that currents through each half of the transformer 80' are of the opposite polarity. As a result, there will be no net flux generated and no voltage transferred across to the secondary of the transformer 80'. Once a signal is applied, one side of the circuit or the other may turn on and the circuit may draw significant current through one of the sides of the primary of the transformer 80', thereby setting up a net flux in the transformer 80'. Once the polarity of the input signal changes, the opposite side of the circuit may turn on with a resulting change in the polarity of the flux within the transformer 80'. Since only the NMOS devices 104, 108 are part of the signal path, only the NMOS devices 104, 108 may affect the maximum current load and the speed of the improved line driver output stage 400. The PMOS devices may provide a current fixed by voltages VDD and VP in order to limit cross over distortion as the line driver input signal polarity changes.

It should also be noted that the loss in output signal swing due to device saturation is reduced by ½. For a typical push-pull line driver architecture, the effective output signal swing is reduced by the sum of the required drain-to-source voltage of both the NMOS 104, 108 and the PMOS devices 102, 106. For the circuit architecture illustrated in FIG. 6, only the required drain-to-source voltage of the NMOS devices 104, 108 will adversely affect the output signal voltage range. As a result, the loss in output signal swing range is reduced by a factor of 2, yielding an improved line driver output stage 400 with higher operating efficiency.

It is of further significance to note that since the improved line driver output stage 400 in accordance with the present invention uses a simple current source to establish the quiescent current, class A-B amplifier control requirements may be significantly simplified. For a conventional, push-pull, class A-B architecture, establishing a well controlled, process independent class A-B control loop is one of the most challenging sections of the overall line driver design. A slight mismatch in the control loop may change the quiescent current by more than a factor of two, resulting in yield problems. In order to preserve stability, the class A-B control loop is typically designed to be significantly slower than the signal path of the line driver, which can yield odd settling behaviors and distortion. As a result, it is easy to see line driver circuit architectures that reduce the range of class A-B control requirements are highly desirable.

Figure 7:
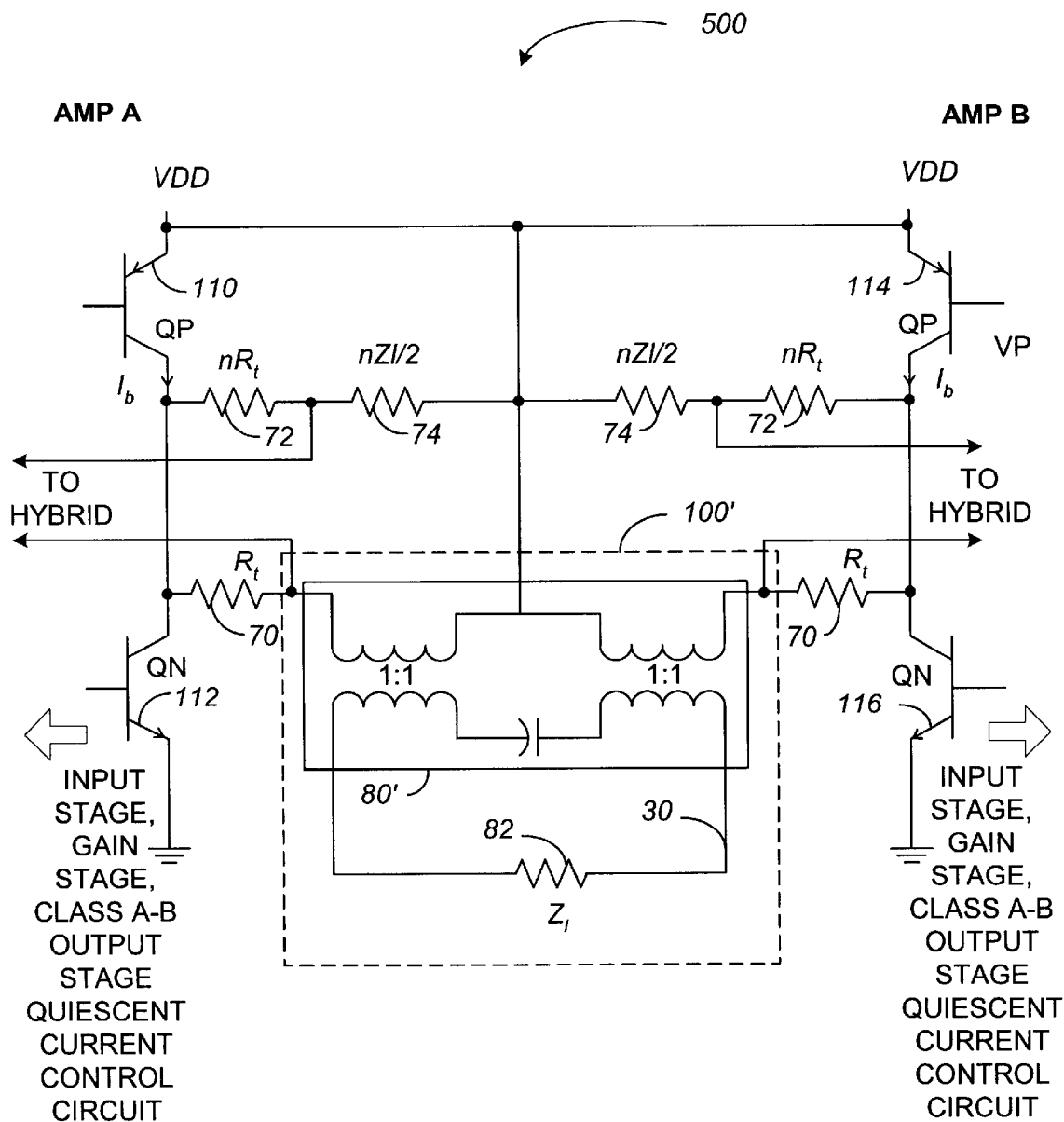
FIG. 7 is a circuit diagram of a third embodiment of an improved output stage of a bipolar CMOS line driver in accordance with the present invention.

Having introduced and described both a first embodiment of an improved output stage of a CMOS line driver 300 in accordance with regard to FIG. 5, as well as, a second improved output stage of a CMOS line driver 400 with regard to FIG. 6, reference is now directed to FIG. 7. In this regard, FIG. 7 illustrates a third preferred embodiment of an improved output stage of a bipolar CMOS line driver in accordance with the present invention.

As illustrated in FIG. 7, an improved output stage of a bipolar CMOS line driver 500 may comprise a first amplifier, AMP A, a second amplifier, AMP B, a load 100', and integrated back-matching resistors 70, 72, and 74. The load 100' may comprise a center tap transformer 80', the twisted-pair telephone transmission line 30, and may be characterized by a load impedance 82, herein designated $Z_l$. Both the first amplifier, AMP A, and the second amplifier, AMP B, may comprise a plurality of semiconductor devices. As illustrated in FIG. 7, AMP A may comprise a series combination of bipolar PNP and NPN semiconductor devices. Proceeding from VDD at the top of FIG. 7 to ground, AMP A may comprise-PNP device (QP) 110 and NPN device (QN) 112. Similarly, AMP B may comprise PNP device (QP) 114 and NPN device (QN) 116. As illustrated in FIG. 6, two back-matching resistors 70, herein labeled $R_t$, may be coupled between the primary of the transformer 80' and a node interposed between a series combination of the QP 110, 114 and QN 112, 116 devices of the first and second amplifiers respectively. In addition a series combination of scaled resistors $nR_t$ 72 and $nZ_l/2$ 74 may be interposed in parallel with the two back-matching resistors $R_t$ 70 between VDD, the center tap of the transformer 80', and the node interposed between the first and second amplifiers respectively.

The QP devices 110, 114 of both the first and second amplifiers could be implemented with standard low-performance lateral PNP semiconductor devices, while the signal and load current is supplied by the NPN devices 112, 116. Hence, a high-performance high-efficiency line driver may be implemented without using a relatively expensive high-performance PNP device. Thus, the improved line driver output stage 500 of the present invention enables design utilization with a variety of semiconductor manufacturing processes that were previously not suited to the push-pull, class A-B design.

Figure 8:
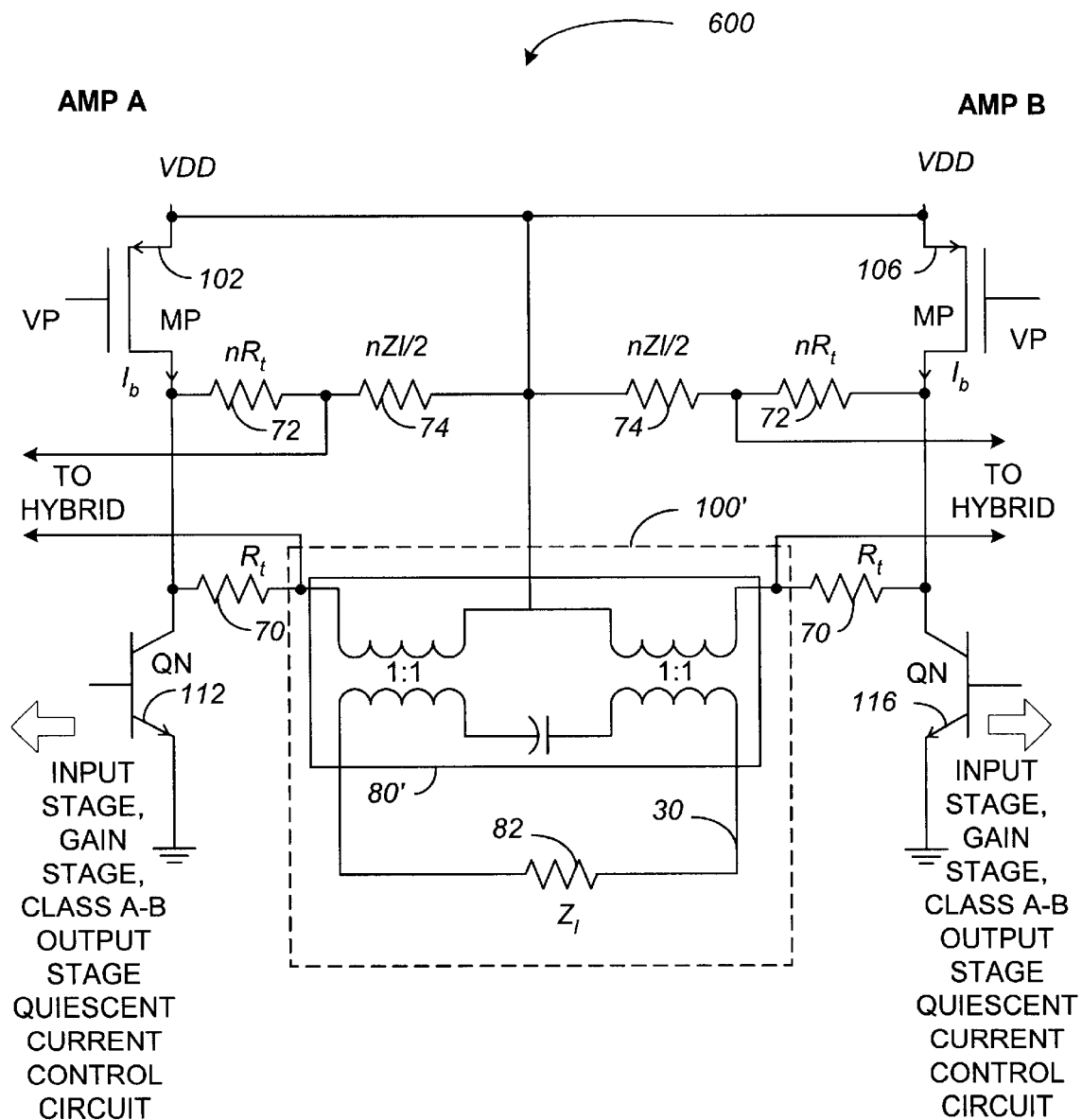
FIG. 8 is a circuit diagram of a fourth embodiment of an improved output stage of a BiCMOS line driver in accordance with the present invention.

Having introduced and described three preferred embodiments of an improved output stage of a CMOS line driver 200, 300, 400 in accordance with the present invention with regard to FIGS. 5–7, reference is now directed to FIG. 8. In this regard, FIG. 8 illustrates a fourth preferred embodiment of an improved output stage of a BiCMOS line driver in accordance with the present invention.

As illustrated in FIG. 8, an improved output stage of a BiCMOS line driver 600 may comprise a first amplifier, AMP A, a second amplifier, AMP B, a load 100', and integrated back-matching resistors 70, 72, and 74. The load 100' may comprise a center tap transformer 80', the twisted-pair telephone transmission line 30, and may be characterized by a load impedance 82, herein designated $Z_l$. Both the first amplifier, AMP A, and the second amplifier, AMP B, may comprise a plurality of semiconductor devices. As illustrated in FIG. 8, AMP A may comprise a series combination of a PMOS device and a bipolar NPN device. Proceeding from VDD at the top of FIG. 8 to ground, AMP A may comprise PMOS device (MP) 102 and NPN device (QN) 112. Similarly, AMP B may comprise PMOS device (MP) 106 and NPN device (QN) 116. As illustrated in FIG. 8, two back-matching resistors 70, herein labeled $R_t$, may be coupled between the primary of the transformer 80' and a node interposed between a series combination of the MP 102, 106 and QN 112, 116 devices of the first and second amplifiers respectively. In addition, a series combination of scaled resistors $nR_t$ 72 and $nZ_l/2$ 74 may be interposed in parallel with the two back-matching resistors, $R_t$ 70 between VDD, the center tap of the transformer 80', and the node interposed between the first and second amplifiers respectively.

The improved line driver output stage 600 as illustrated in FIG. 8 and consistent with the teachings of the present invention may be implemented in a low cost BiCMOS process, where the only bipolar devices are low cost NPN devices 112, 116. The NPN devices 112, 116 may be implemented with the addition of a base layer, using the n+source for the emitter and the n-well for the collector. This modification can be implemented for a processing cost increase of about 5% for most standard CMOS manufacturing processes. This approach is ideal in that it can provide a relatively high performance NPN device with minimal added cost.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of the present invention and protected by the following claims.

Therefore, having thus described the invention, at least the following is claimed:

1. A line driver output stage, comprising:
   a first amplifier comprising a series combination of a first semiconductor device and a second semiconductor device;
   a second amplifier comprising a series combination of a first semiconductor device and a second semiconductor device;
   a first transformer in parallel with the first semiconductor device of the first amplifier;
   a second transformer in parallel with the first semiconductor device of the second amplifier;
   a first back-matching resistor network interposed between the first and the second semiconductor device of the first amplifier, the first back-matching resistor network coupled to a supply voltage, the first semiconductor device of the first amplifier, and a first primary terminal of a first transformer at a first node, the first back-matching resistor network further coupled to a second terminal of a first transformer and a second node interposed between the first and the second semiconductor devices of the first amplifier; and
   a second back-matching resistor network interposed between the first and the second semiconductor device of the second amplifier, the second back-matching resistor network coupled to the supply voltage, the first semiconductor device of the second amplifier, and a first primary terminal of a second transformer at a third node, the second back-matching resistor network further coupled to a second terminal of a second transformer and a fourth node interposed between the first and the second semiconductor devices of the second amplifier.

2. The line driver output stage of claim 1, wherein an input signal is applied to a gate of the second semiconductor devices of the first and second amplifiers respectively.

3. The line driver output stage of claim 1, wherein the secondaries of the first and second transformers are coupled in series.

4. The line driver output stage of claim 1, wherein the gates of the first semiconductor devices of the first and second amplifiers are coupled to a bias voltage.

5. The line driver output stage of claim 1, wherein the first semiconductor devices of the first and second amplifiers provide a current that limits cross over distortion when the polarity of an input signal changes.

6. The line driver output stage of claim 1, wherein the loss in output signal swing due to device saturation is reduced by approximately one-half over the loss in output signal swing due to device saturation in a conventional push-pull line driver.

7. The line driver output stage of claim 1, both the first and the second back-matching resistor networks further comprising:
   a first resistor having a resistance that emulates the a transmission line impedance as seen at the primary of the respective transformer, the first resistor of the first back-matching resistor network coupled to the first node and the second node, the first resistor of the second back-matching resistor network coupled to the third node and the fourth node.

8. The line driver output stage of claim 2, wherein the second semiconductor devices of the first and second amplifiers comprise a NMOS device.

9. The line driver output stage of claim 2, wherein the second semiconductor devices of the first and second amplifiers comprise a NPN bipolar device.

10. The line driver output stage of claim 2, wherein a bipolar signal output is generated across the secondaries of the first and second transformers without altering the direction of current flow through the primaries of the first and second transformers.

11. The line driver output stage of claim 7, wherein the first resistor of both the first and the second back-matching resistor networks is an integrated resistor.

12. The line driver output stage of claim 7, both the first and the second back-matching resistor networks further comprising:
   a second resistor having a resistance that approximates the product of the resistance of the first resistor and a scale factor; and
   a third resistor having a resistance that approximates the product of one-half the line impedance as seen at both primaries of the first and the second transformers and the scale factor.

13. The line driver output stage of claim 12, wherein both the second and the third resistors of both the first and the second back-matching resistor networks comprise an integrated resistor.

14. A line driver output stage, comprising:
   a first amplifier comprising a series combination of a first semiconductor device and a second semiconductor device;
   a second amplifier comprising a series combination of a first semiconductor device and a second semiconductor device;
   a transformer with a center tap, the center tap coupled to a power supply, the transformer having a primary comprising a first terminal and a second terminal;
   a first back-matching resistor network interposed between the first and the second semiconductor device of the first amplifier, the first back-matching resistor network coupled to the supply voltage, the first semiconductor device of the first amplifier, the first primary terminal and the center tap of the transformer; and
   a second back-matching resistor network interposed between the first and the second semiconductor device of the second amplifier, the second back-matching resistor network coupled to the supply voltage, the first semiconductor device of the second amplifier, the second primary terminal and the center tap of the transformer.

15. The line driver output stage of claim 14, wherein an input signal is applied to a gate of the second semiconductor devices of the first and second amplifiers respectively.

16. The line driver output stage of claim 14, wherein the gates of the first semiconductor devices of the first and second amplifiers are coupled to a bias voltage.

17. The line driver output stage of claim 14, wherein the first semiconductor devices of the first and second amplifiers provide a current that limits cross over distortion when the polarity of an input signal changes.

18. The line driver output stage of claim 14, wherein the loss in output signal swing due to device saturation is reduced by approximately one-half over the loss in output signal swing due to device saturation in a conventional push-pull line driver.

19. The line driver output stage of claim 14, both the first and the second back-matching resistor networks further comprising:
   a first resistor having a resistance that emulates one-half of a transmission line impedance as seen at the primary of the transformer, the first resistor of the first back-matching resistor network coupled between a first node at the intersection of the first and second semiconductor devices of the first amplifier, the first resistor of the first back-matching resistor network further coupled to the first primary terminal, the first resistor of the second back-matching resistor network coupled to a second node at the intersection of the first and the second semiconductor devices of the second amplifier, the first resistor of the second back-matching resistor network further coupled the second primary terminal.

20. The line driver output stage of claim 15, wherein the second semiconductor devices of the first and second amplifiers comprise a NMOS device.

21. The line driver output stage of claim 15, wherein the second semiconductor devices of the first and second amplifiers comprise a NPN bipolar device.

22. The line driver output stage of claim 19, wherein the first resistor of both the first and the second back-matching resistor networks is an integrated resistor.

23. The line driver output stage of claim 19, both the first and the second back-matching resistor networks further comprising:

a second resistor having a resistance that approximates the product of the resistance of the first resistor and a scale factor; and a third resistor having a resistance that approximates the product of one-half the line impedance as seen at the primary of the transformer and the scale factor.

24. The line driver output stage of claim 21, wherein the first semiconductor devices of the first and second amplifiers comprise a PNP bipolar device.

25. The line driver output stage of claim 23, wherein both the second and the third resistors of both the first and the second back-matching resistor networks comprise an integrated resistor.

26. The line driver output stage of claim 23, wherein both the second and the third resistors.of both the first and the second back-matching resistor networks are coupled to each other in series, the series combination further coupled between the center tap of the transformer and a node between the first and second semiconductor devices of the first and second amplifiers respectively.

27. A transmission unit, comprising:

a line driver having an output stage, wherein the output stage is capable of sinking up to four times the current as a conventional push-pull line driver, the output stage having a controlled current source configured to supply a quiescent current to control cross over distortion, the output stage comprising NMOS devices in the signal path.

28. The transmission unit of claim 27, wherein the output stage signal path comprises NPN bipolar devices.

29. A communications system, comprising:

a transmission unit having an integrated line driver, the integrated line driver having an output stage, wherein the output stage is capable of sinking up to four times as much current as a conventional push-pull line driver, the output stage having a controlled current source configured to supply a quiescent current to control cross over distortion, the output stage comprising NMOS devices in the signal path.

30. A method of increasing the available signal transmit power on a transmission line, comprising:

applying a transmit signal to an input stage of an integrated line driver;

amplifying the transmit signal in the output stage of a line driver using amplifier components selected from the group consisting of NMOS and NPN bipolar semiconductor devices in the output stage signal path; and applying the amplified transmit signal via a plurality of resistor networks to the transmission line.

31. The method of claim 30, wherein the plurality of resistor networks comprises:

a plurality of integrated resistors.

32. The method of claim 31, wherein plurality of integrated resistors have a resistance value selected in response to an expected load impedance.

33. The method of claim 32, wherein the integrated resistors comprise:

a pair of resistors selected such that the sum of their resistance values approximates an expected load impedance, wherein each of the resistors supplies half of the available signal transmit power to a load.

34. The method of claim 32, wherein the integrated resistors comprise:

a pair of resistors selected such that a sum of the product of their resistance values and a scale factor approximates one half of an expected load impedance.

35. The method of claim 32, wherein the integrated resistors comprise:

a pair of resistors selected such that a sum of the product of their resistance values and a scale factor approximates one-half of an expected transmission line load impedance.

* * * * *